United States Patent
Kamata et al.

(10) Patent No.: US 7,446,631 B2
(45) Date of Patent: Nov. 4, 2008

(54) RADIO FREQUENCY INDUCTIVE-CAPACITIVE FILTER CIRCUIT TOPOLOGY

(75) Inventors: Takatsugu Kamata, Yokohama (JP); Kazunori Okui, Newark, CA (US)

(73) Assignee: RF Stream Corporation, Osaka (JP)

( * ) Notice: Subject to any disclaimer, the term of this patent is extended or adjusted under 35 U.S.C. 154(b) by 319 days.

(21) Appl. No.: 11/373,743

(22) Filed: Mar. 10, 2006

(65) Prior Publication Data

US 2006/0208832 A1   Sep. 21, 2006

Related U.S. Application Data

(60) Provisional application No. 60/660,943, filed on Mar. 11, 2005.

(51) Int. Cl.
*H03H 7/00* (2006.01)
*H04N 5/50* (2006.01)

(52) U.S. Cl. .................. 333/167; 333/174; 455/180.2; 348/731

(58) Field of Classification Search ............... 333/167, 333/174–177; 455/180.2, 188.2, 191.1, 193.1; 348/731
See application file for complete search history.

(56) References Cited

U.S. PATENT DOCUMENTS

| 1,735,742 | A | 11/1929 | Fetter |
|---|---|---|---|
| 2,140,770 | A | 12/1938 | Schofield |
| 2,325,174 | A | 7/1943 | Cooper |
| 2,464,557 | A | 3/1949 | Crockett |
| 2,496,177 | A | 1/1950 | Richards et al. |
| 2,531,312 | A | 11/1950 | Loon |
| 2,549,789 | A | 4/1951 | Ferrill |
| 2,796,524 | A | 6/1957 | Ferrill |
| 2,801,341 | A | 7/1957 | Jaffe |
| 2,815,406 | A | 12/1957 | Tongue |
| 3,252,096 | A | 5/1966 | Carlson |
| 3,400,345 | A | 9/1968 | Oloff |
| 3,488,595 | A | 1/1970 | Vasile |

(Continued)

FOREIGN PATENT DOCUMENTS

EP   0392449 B1   10/1990

(Continued)

OTHER PUBLICATIONS

U.S. Appl. No. 11/700,687, filed Jan. 30, 2007, Utsunomiya.

(Continued)

*Primary Examiner*—Seungsook Ham
(74) *Attorney, Agent, or Firm*—Stattler-Suh PC

(57) ABSTRACT

A filter circuit topology for filtering a radio frequency input signal includes one or more inductor devices, such as, for example, discrete chip or air coils. The inductor devices are center tapped into a capacitor coupled to the ground. The center-tapped inductor configuration splits the output voltage across the inductor devices into two equal voltages of predetermined amplitude determined by the quality factor of the filter circuit. The filter circuit further includes an input capacitor to receive the RF input signal and an output capacitor coupled respectively to the inductor devices, the output capacitor having a variable capacitance, the inductor devices and the variable capacitor forming an inductive-capacitive (LC) filter capable of filtering the RF input signal and generating an output filtered signal for further transmission to a television tuner.

17 Claims, 5 Drawing Sheets

U.S. PATENT DOCUMENTS

| | | | |
|---|---|---|---|
| 3,509,500 A | 4/1970 | McNair et al. | |
| 3,544,903 A | 12/1970 | Sakamoto | |
| 3,686,575 A | 8/1972 | Chamberlain | |
| 3,794,941 A | 2/1974 | Templin | |
| 3,931,578 A | 1/1976 | Gittinger | |
| 4,112,378 A | 9/1978 | Ito et al. | |
| 4,118,679 A | 10/1978 | Hiday et al. | |
| 4,138,654 A | 2/1979 | Luhowy | |
| 4,182,997 A * | 1/1980 | Brambilla | 333/175 |
| 4,296,391 A | 10/1981 | Hazama et al. | |
| 4,330,794 A | 5/1982 | Sherwood | |
| 4,379,271 A | 4/1983 | Lehmann | |
| 4,456,895 A | 6/1984 | Landt et al. | |
| 4,514,763 A | 4/1985 | Rindal | |
| 4,555,809 A | 11/1985 | Carlson | |
| 4,598,423 A | 7/1986 | Hettiger | |
| 4,785,253 A | 11/1988 | Hughes | |
| 4,789,897 A | 12/1988 | Kappeler et al. | |
| 4,812,851 A | 3/1989 | Giubardo | |
| 4,818,903 A | 4/1989 | Kawano | |
| 4,882,614 A | 11/1989 | Kageyama et al. | |
| 4,907,292 A * | 3/1990 | Leipert | 455/280 |
| 4,970,479 A | 11/1990 | Landt et al. | |
| 4,985,769 A | 1/1991 | Yasumoto et al. | |
| 4,988,902 A | 1/1991 | Dingwall | |
| 5,077,542 A | 12/1991 | Lanoiselee | |
| 5,122,868 A | 6/1992 | Isnardi | |
| 5,146,337 A | 9/1992 | Grubbs | |
| 5,146,338 A | 9/1992 | Lehmann et al. | |
| 5,148,280 A | 9/1992 | Wignot et al. | |
| 5,155,580 A | 10/1992 | Gibson et al. | |
| 5,187,445 A | 2/1993 | Jackson | |
| 5,263,018 A | 11/1993 | Christopher | |
| 5,264,937 A | 11/1993 | Christopher | |
| 5,287,180 A | 2/1994 | White | |
| 5,386,239 A | 1/1995 | Wang et al. | |
| 5,491,715 A | 2/1996 | Flaxl | |
| 5,519,265 A | 5/1996 | Latham | |
| 5,525,940 A | 6/1996 | Hekkila et al. | |
| 5,663,773 A | 9/1997 | Goeckler | |
| 5,737,035 A | 4/1998 | Rotzoll | |
| 5,898,900 A | 4/1999 | Richter et al. | |
| 5,905,398 A | 5/1999 | Todsen et al. | |
| 5,914,633 A | 6/1999 | Comino et al. | |
| 5,917,387 A | 6/1999 | Rice | |
| 5,956,098 A | 9/1999 | Mizukami | |
| 6,016,170 A | 1/2000 | Takayama et al. | |
| 6,094,236 A | 7/2000 | Abe et al. | |
| 6,104,442 A | 8/2000 | Patel et al. | |
| 6,137,773 A | 10/2000 | Stilwell et al. | |
| 6,169,569 B1 | 1/2001 | Widmer et al. | |
| 6,177,964 B1 | 1/2001 | Birleson | |
| 6,219,376 B1 | 4/2001 | Zhodzishsky et al. | |
| 6,226,509 B1 | 5/2001 | Mole et al. | |
| 6,243,567 B1 | 6/2001 | Saito | |
| 6,256,495 B1 | 7/2001 | Francisco et al. | |
| 6,275,113 B1 | 8/2001 | Nakano et al. | |
| 6,307,443 B1 | 10/2001 | Gabara | |
| 6,307,897 B1 | 10/2001 | Ohta et al. | |
| 6,324,233 B1 | 11/2001 | Sempel et al. | |
| 6,351,293 B1 | 2/2002 | Perlow | |
| 6,359,940 B1 | 3/2002 | Ciccarelli et al. | |
| 6,377,315 B1 | 4/2002 | Carr et al. | |
| 6,407,622 B1 | 6/2002 | Opris | |
| 6,424,206 B2 | 7/2002 | Takahashi et al. | |
| 6,424,209 B1 | 7/2002 | Gorecki et al. | |
| 6,470,055 B1 | 10/2002 | Feyer | |
| 6,535,075 B2 | 3/2003 | Frech et al. | |
| 6,535,722 B1 | 3/2003 | Rosen et al. | |
| 6,538,521 B2 | 3/2003 | Kobayashi et al. | |
| 6,593,828 B1 | 7/2003 | Helfenstein et al. | |
| 6,597,748 B1 | 7/2003 | Hietala et al. | |
| 6,628,728 B1 | 9/2003 | McCarty, Jr. | |
| 6,631,256 B2 | 10/2003 | Suominen | |
| 6,636,085 B2 | 10/2003 | Okazaki et al. | |
| 6,657,678 B1 | 12/2003 | Mizukami et al. | |
| 6,667,649 B1 | 12/2003 | Lee | |
| 6,667,760 B1 | 12/2003 | Limberg | |
| 6,680,971 B1 | 1/2004 | Tazebay | |
| 6,686,817 B2 | 2/2004 | Zhu | |
| 6,714,608 B1 | 3/2004 | Samueli et al. | |
| 6,724,441 B2 | 4/2004 | Choi | |
| 6,725,463 B1 | 4/2004 | Birleson | |
| 6,744,335 B2 | 6/2004 | Ryhanen et al. | |
| 6,750,734 B2 | 6/2004 | Utsunomiya et al. | |
| 6,778,022 B1 | 8/2004 | Zhang et al. | |
| 6,778,594 B1 | 8/2004 | Liu | |
| 6,850,747 B1 | 2/2005 | Imbornone et al. | |
| 6,856,652 B2 | 2/2005 | West et al. | |
| 6,873,369 B2 | 3/2005 | Koyama | |
| 6,882,245 B2 | 4/2005 | Utsunomiya et al. | |
| 6,911,861 B2 | 6/2005 | Deng | |
| 6,933,984 B2 * | 8/2005 | Yamamoto et al. | 348/731 |
| 6,937,670 B2 | 8/2005 | Cowley et al. | |
| 6,940,358 B1 | 9/2005 | Meacham | |
| 6,940,365 B2 | 9/2005 | Kamata et al. | |
| 6,954,115 B2 | 10/2005 | Wong | |
| 7,079,195 B2 | 7/2006 | Birleson et al. | |
| 7,106,388 B2 | 9/2006 | Vorenkamp et al. | |
| 7,224,210 B2 | 5/2007 | Garlapati et al. | |
| 7,239,357 B2 | 7/2007 | Jaffe | |
| 7,289,780 B2 * | 10/2007 | Yamamoto | 455/180.4 |
| 2002/0047942 A1 | 4/2002 | Vorenkamp | |
| 2002/0050861 A1 | 5/2002 | Nguyen et al. | |
| 2002/0186099 A1 | 12/2002 | Sengupta | |
| 2003/0053562 A1 | 3/2003 | Busson et al. | |
| 2003/0097601 A1 | 5/2003 | Glas et al. | |
| 2003/0132455 A1 | 7/2003 | Utsunomiya et al. | |
| 2003/0186671 A1 | 10/2003 | Prodanov et al. | |
| 2003/0197810 A1 | 10/2003 | Jaffe | |
| 2003/0223017 A1 | 12/2003 | Utsunomiya et al. | |
| 2004/0095513 A1 | 5/2004 | Takatsugu et al. | |
| 2004/0198289 A1 | 10/2004 | Ashkenazi | |
| 2004/0233029 A1 | 11/2004 | Pohl et al. | |
| 2005/0143039 A1 | 6/2005 | Takatsugu et al. | |
| 2006/0028301 A1 | 2/2006 | Takatsugu et al. | |
| 2006/0229046 A1 | 10/2006 | Bult | |

FOREIGN PATENT DOCUMENTS

| | | |
|---|---|---|
| EP | 0676880 | 10/1995 |
| EP | 0707379 A1 | 4/1996 |
| JP | 11122067 A2 | 4/1999 |
| JP | 11122068 A2 | 4/1999 |
| WO | WO 9522839 | 8/1995 |
| WO | WO 9639778 | 12/1996 |
| WO | WO 0106637 A1 | 1/2001 |
| WO | WO 0128310 | 4/2001 |

OTHER PUBLICATIONS

U.S. Appl. No. 11/700,515, filed Jan. 30, 2007, Utsunomiya.
U.S. Appl. No. 11/732,505, filed Apr. 2, 2007, Utsunomiya.
U.S. Appl. No. 11/700,511, filed Jan. 30, 2007, Utsunomiya.
International Search Report for related foreign application PCT/US02/33077.
U.S. Appl. No. 11/373,555, filed Mar. 10, 2006, Takatsugu Kamata.
U.S. Appl. No. 11/372,602, filed Mar. 10, 2006, Takatsugu Kamata.

* cited by examiner

RADIO FREQUENCY INDUCTIVE-CAPACITIVE FILTER CIRCUIT TOPOLOGY

CROSS-REFERENCE TO RELATED APPLICATIONS

This application claims the benefit of U.S. Provisional Patent Application Ser. No. 60/660,943, filed on Mar. 11, 2005, and entitled "Radio Frequency Inductive-Capacitive Filter Topology."

BACKGROUND OF THE INVENTION

1. Field of the Invention

The invention relates generally to the field of electronic circuits, and, more particularly, to a circuit topology for filtering a radio frequency signal.

2. Art Background

Typically, receivers employ filter circuits to condition both input signals and internally generated reference signals. For example, band pass, notch, and low pass filters are types of filter circuits employed in such receivers. The frequency response of a filter refers to the characteristics of the filter that condition the signal input to the filter. For example, a band pass filter may attenuate an input signal across a predetermined band of frequencies above and below a center frequency of the filter. Filter circuits are designed to exhibit frequency responses based on one or more circuit parameters.

Some receivers are designed to process input signals within a range of input carrier frequencies (e.g., broadband receivers). For example, television receivers must be capable of processing input television signals with carrier frequencies ranging from 48 MHz to 890 MHz.

A popular application for filter circuits involves their use in television tuners. It is a conventional practice to mix an antenna signal with a local oscillator frequency for conversion to an intermediate frequency. However, prior to such mixing of signals, filters are necessary to filter out the useful signal band from the broadband reception signal.

Generally, mobile television requires small and thin television tuner modules. Thus, the filtering and mixing circuit blocks are usually incorporated on an integrated circuit (IC). Since the circuit blocks share the same substrate and need to reduce leakage to the substrate, an unbalanced to balanced filter is typically used within the television tuner.

FIG. 1 is a schematic diagram illustrating a prior art filter circuit to be used with a known television tuner module. As shown in FIG. 1, an unbalanced to balanced filter circuit 100 includes a transformer 110 coupled to a capacitor 120 having a variable capacitance C. The transformer 110 is an alternating current (AC) circuit, which further includes a primary coil 111 to receive a radio frequency input signal RFIN and a secondary coil 112, which are coupled to each other, for example, through a magnetic medium. The output terminations of the secondary coil 112 are coupled to the variable capacitor 120.

FIG. 2 is a graph illustrating various transfer functions for predetermined capacitance values of the variable capacitor 120 within the prior art filter circuit 100. As shown in FIG. 2, the transfer functions 200 correspond to different capacitance values of the variable capacitor 120, such as, for example, 4 picoFarad (pF), 8 pF, 16 pF, 32 pF, 64 pF, and 128 pF.

If the transformer 110 is a planar transformer, such as, for example, a 100 nanoHenry (nH) transformer, the thickness of the module needs to be maintained at a predetermined value, such as, for example, more than 1 millimeter, because the distance between the transformer 110 and a lid on the module should be maintained constant in order to minimize the loss. In addition, the total cost of the filter circuit 100 is relatively high due to the high cost of the planar transformer 110. Thus, what is needed is a filter circuit configuration, which is inexpensive and achieves a significant minimization of the module thickness and size.

SUMMARY OF THE INVENTION

A filter circuit topology for filtering a radio frequency input signal includes one or more inductor devices, such as, for example, discrete chip or air coils. The inductor devices are center tapped into a capacitor coupled to the ground. The center-tapped inductor configuration splits the output voltage across the inductor devices into two equal voltages of predetermined amplitude determined by the quality factor of the filter circuit. The filter circuit further includes an input capacitor to receive the RF input signal and an output capacitor coupled respectively to the inductor devices, the output capacitor having a variable capacitance, the inductor devices and the variable capacitor forming an inductive-capacitive (LC) filter capable of filtering the RF input signal and generating an output filtered signal for further transmission to a television tuner.

Other features of the invention will be apparent from the accompanying drawings, and from the detailed description, which follows below.

DETAILED DESCRIPTION

The disclosure of U.S. Provisional Patent Application Ser. No. 60/660,943, filed on Mar. 11, 2005, and entitled "Radio Frequency Inductive-Capacitive Filter Topology," is expressly incorporated by reference herein in its entirety. Although the invention is described below in terms of specific exemplary embodiments, one skilled in the art will realize that various modifications and alterations may be made to the below embodiments without departing from the spirit and scope of the invention. For example, methods of the invention for filtering a radio frequency signal within a television tuner are described below. One skilled in the arts will realize, however, that the methods for filtering the radio frequency signal may also be applied to filters associated with other types of tuners.

Figure 1:
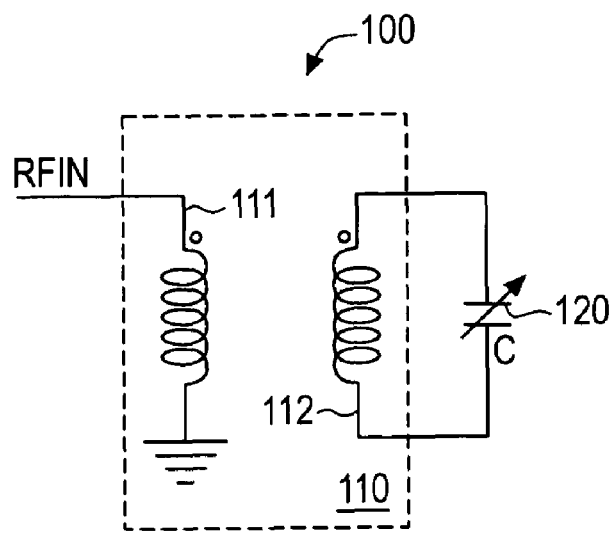
FIG. 1 is a schematic diagram illustrating a prior art filter circuit.
Figure 3:
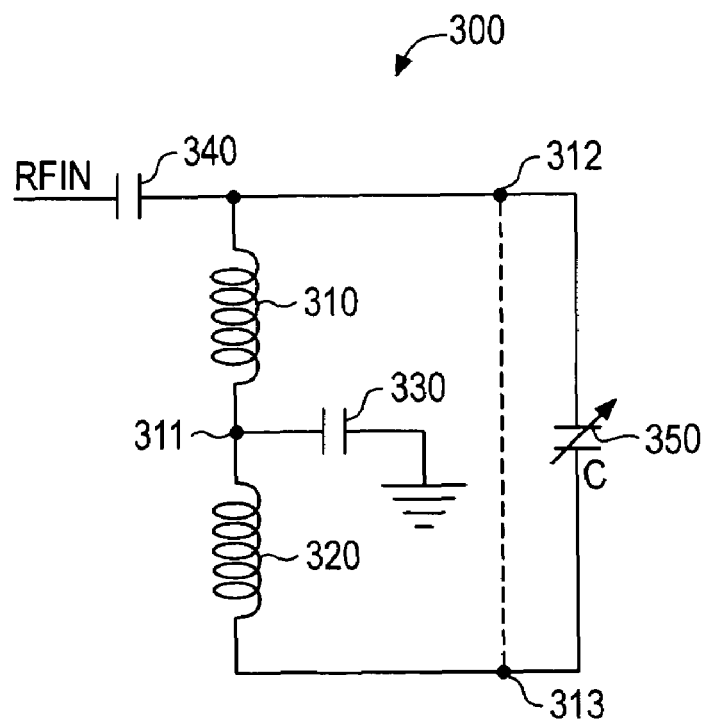
FIG. 3 is a schematic diagram illustrating a filter circuit, according to one embodiment of the invention.
Figure 2:
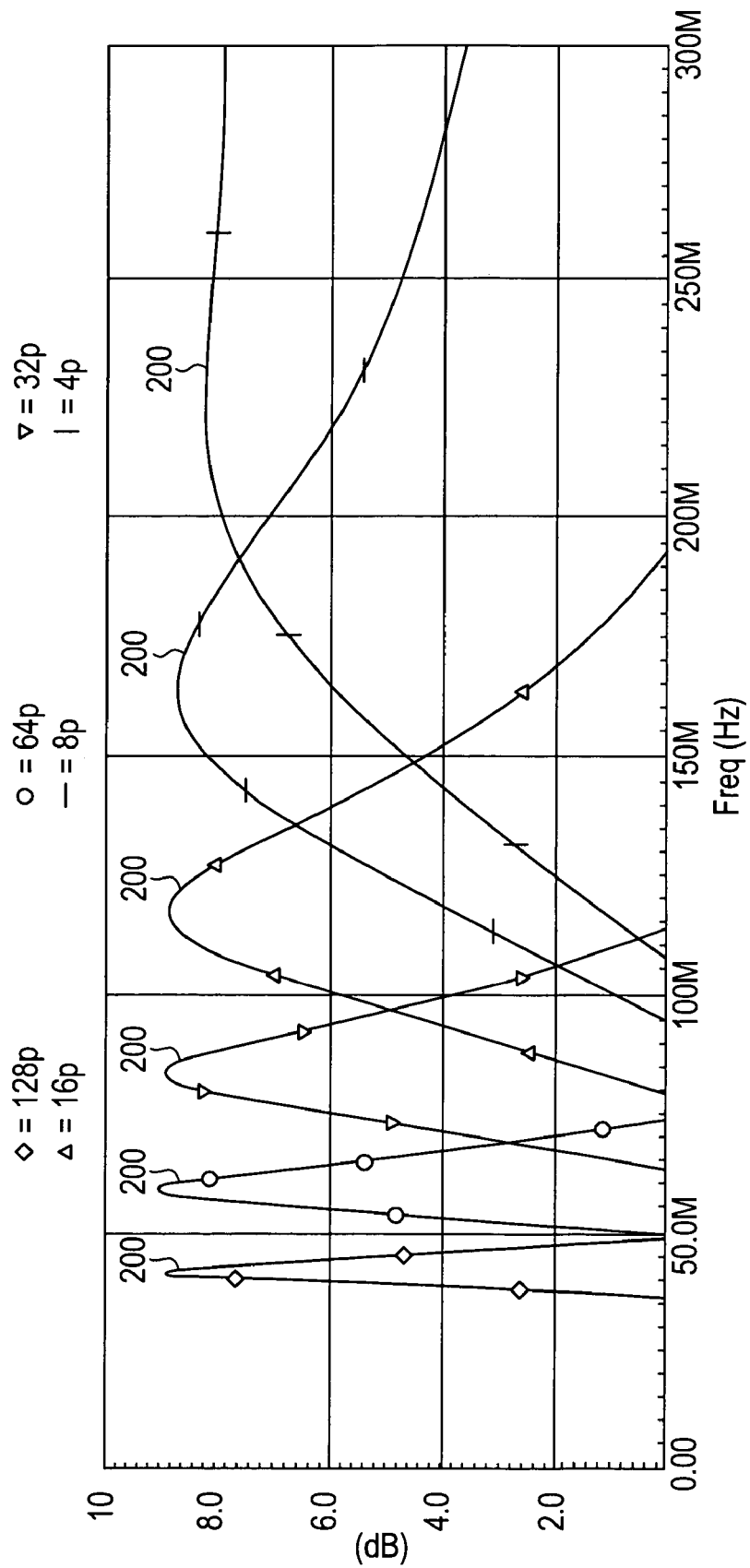
FIG. 2 is a graph illustrating various transfer functions for predetermined capacitance values of a capacitor within the prior art filter circuit.

FIG. 3 is a schematic diagram illustrating a filter circuit, according to one embodiment of the invention. As illustrated in FIG. 3, in one embodiment, a filter circuit 300 includes one or more inductor devices, such as, for example, discrete chip or air coils, of which inductor devices 310 and 320 are shown. The inductor devices 310, 320 are center tapped at node 311 into a capacitor 330 coupled to the ground. The center-tapped inductor configuration splits the output voltage across the inductor devices 310, 320 into two equal voltages of predetermined amplitude determined by the quality factor, also known as the Q factor, of the filter circuit.

In one embodiment, the filter circuit 300 further includes an input capacitor 340 to receive the radio frequency input signal RFIN and an output capacitor 350 coupled respectively to the inductor devices 310, 320, the output capacitor 350 having a variable capacitance C, the inductor devices 310, 320 and the variable capacitor 350 forming an inductive-capacitive (LC) filter capable of filtering the input signal RFIN and generating a filtered signal for further transmission to a television tuner (not shown), for example.

Due to the presence of the inductor devices 310, 320, such as, for example, the discrete chip coils and/or air coils, the filter circuit configuration 300 achieves a total thickness of less than 0.5 millimeter. In an alternate embodiment, planar coils with a center tap may be used to achieve a module thickness and filtering characteristics similar to the filter circuit shown in FIG. 3.

Figure 4:
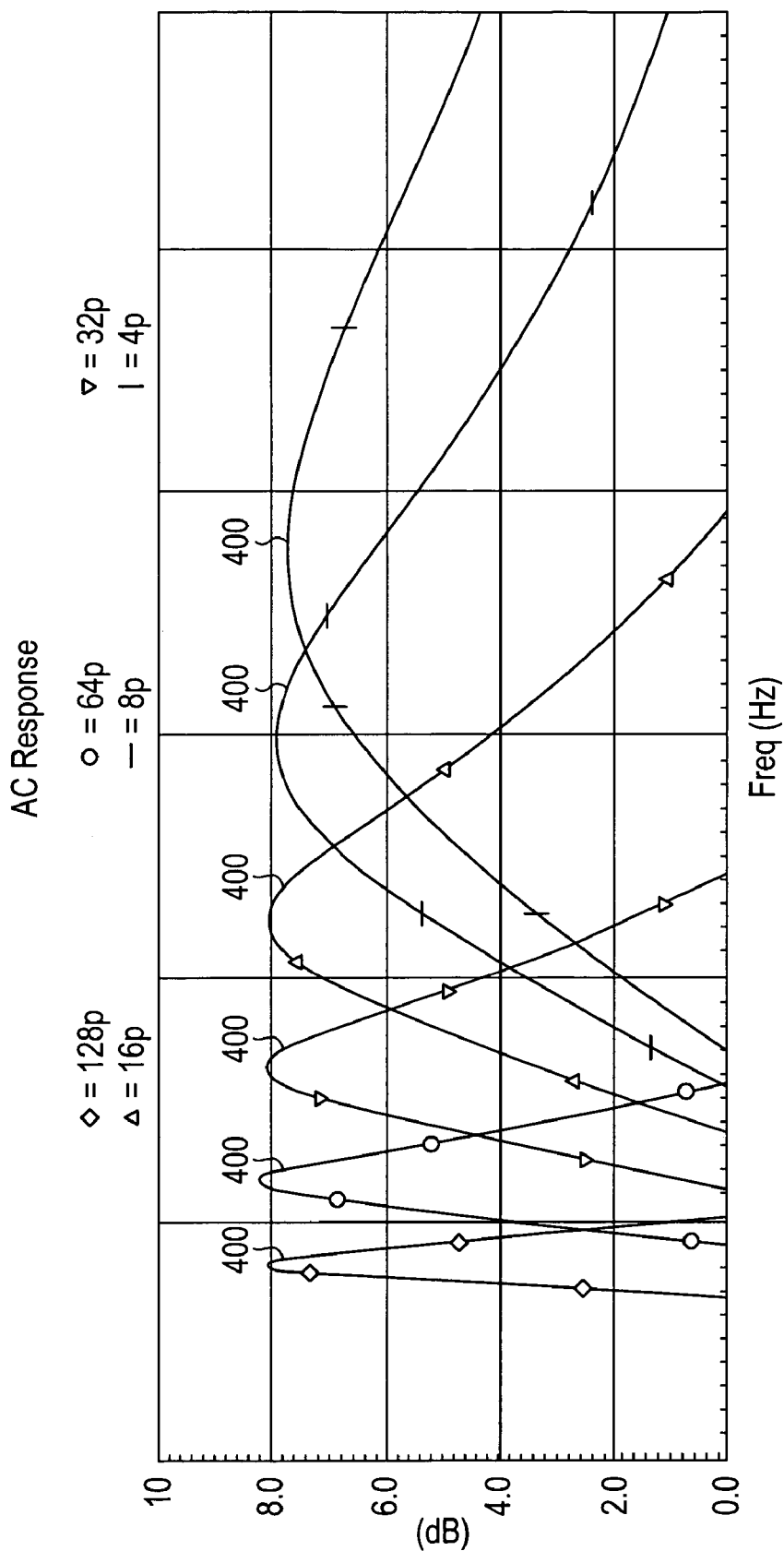
FIG. 4 is a graph illustrating various transfer functions for predetermined capacitance values of a capacitor within the filter circuit, according to one embodiment of the invention.

FIG. 4 is a graph illustrating various transfer functions for predetermined capacitance values of a capacitor within the filter circuit, according to one embodiment of the invention. As shown in FIG. 4, the transfer functions 400 correspond to different capacitance values of the variable capacitor 350, such as, for example, 4 picoFarad (pF), 8 pF, 16 pF, 32 pF, 64 pF, and 128 pF.

Referring back to FIG. 3, in one embodiment, the input alternating current (AC) signal RFIN travels through the input capacitor 340 and the output capacitor 350 and into a loop through the two inductor devices 310, 320. Because of the center tap at node 311, the ground is always centered at zero and the input signal RFIN is converted into a differential signal at nodes 312 and 313 of the filter circuit 300.

Figure 5:
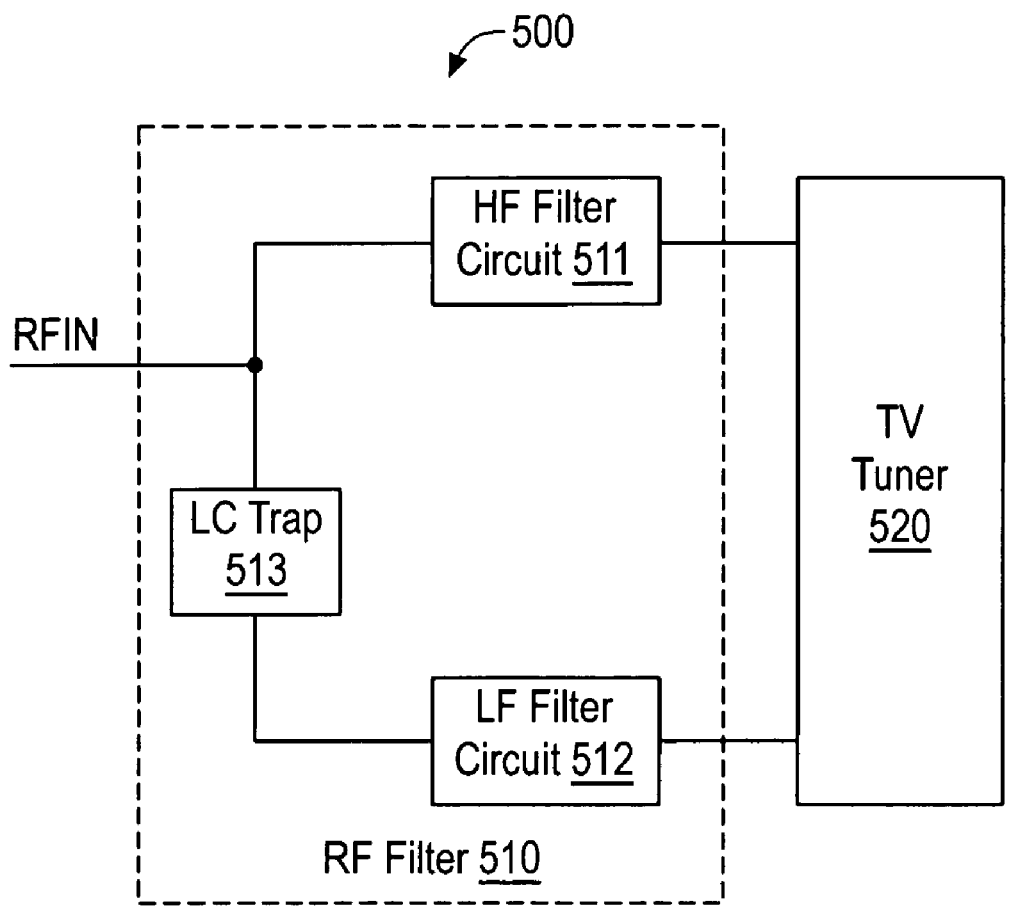
FIG. 5 is a block diagram illustrating a topology to filter a radio frequency signal and to transmit the filtered signal to a television tuner, according to one embodiment of the invention.

FIG. 5 is a block diagram illustrating a topology to filter a radio frequency signal and to transmit the filtered signal to a television tuner, according to one embodiment of the invention. As illustrated in FIG. 5, the topology 500 includes a radio frequency (RF) filter circuit 510, which receives a radio frequency input signal RFIN and generates a filtered differential output signal to be transmitted to a television tuner 520.

In one embodiment, the RF filter circuit 510 further includes at least two unbalanced to balanced filter circuits shifted by a logic control signal, of which a high band (HB) filter circuit 511 and a low band (LB) filter circuit 512 are shown. Each filter circuit 511, 512 receives the broadband radio frequency input signal RFIN and filters the useful signal band from the broadband radio frequency signal RFIN. In one embodiment, the RF filter circuit 510 further includes an LC trap circuit 513 coupled to the LB filter circuit 512 and provided to reduce the amplitude of the input signal RFIN as an anti-aliasing filter for a known subsequent down conversion module (not shown) within the television tuner 520.

Figure 6:
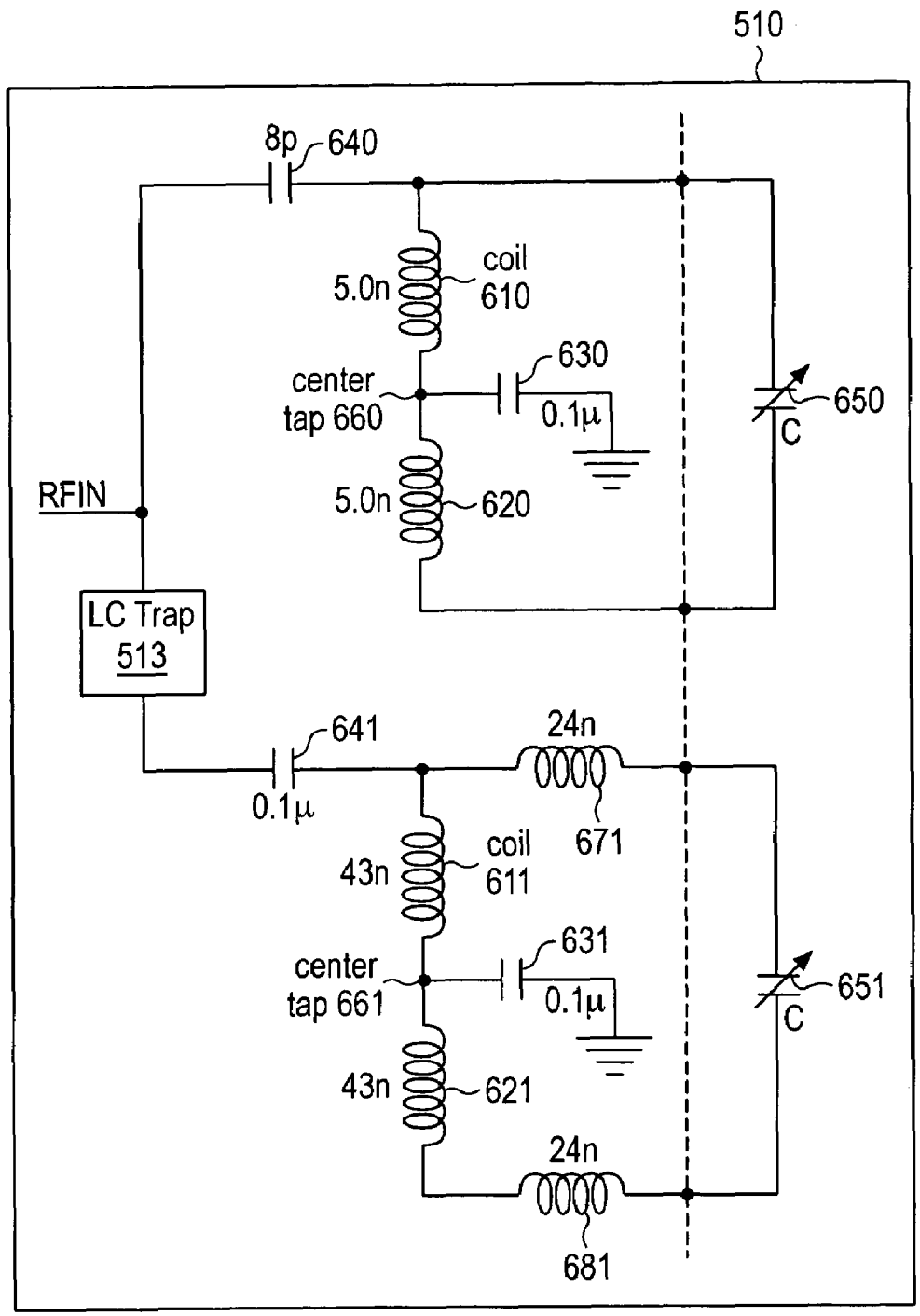
FIG. 6 is a schematic diagram illustrating a circuit topology to filter a radio frequency signal, according to one embodiment of the invention.

FIG. 6 is a schematic diagram illustrating a circuit topology to filter a radio frequency signal, according to one embodiment of the invention. As illustrated in FIG. 6, the RF filter circuit 510 includes at least two unbalanced to balanced filter circuits, a high band (HB) filter circuit to receive the input signal RFIN and a low band (LB) filter circuit to receive the input signal RFIN through an LC trap circuit 513, similar to the filter circuit 300 shown in connection with FIG. 3.

In one embodiment, the HB filter includes one or more inductor devices, such as, for example, discrete chip or air coils, of which inductor devices 610 and 620 are shown. The inductor devices 610, 620 are center tapped at node 660 into a capacitor 630 coupled to the ground. The center-tapped inductor configuration splits the output voltage across the inductor devices 610, 620 into two equal voltages of predetermined amplitude determined by the quality factor, also known as the Q factor, of the filter circuit. In one embodiment, the HB filter circuit further includes an input capacitor 640 to receive the radio frequency input signal RFIN and an output capacitor 650 coupled respectively to the inductor devices 610, 620, the output capacitor 650 having a variable capacitance C, the inductor devices 610, 620 and the variable capacitor 650 forming an inductive-capacitive (LC) filter capable of filtering the input signal RFIN.

In one embodiment, the LB filter includes one or more inductor devices, such as, for example, discrete chip or air coils, of which inductor devices 611, 621, 671, and 681 are shown. The inductor devices 611, 621 are center tapped at node 661 into a capacitor 631 coupled to the ground. The center-tapped inductor configuration splits the output voltage across the inductor devices 611, 621 into two equal voltages of predetermined amplitude determined by the quality factor, also known as the Q factor, of the filter circuit. In one embodiment, the LB filter circuit further includes an input capacitor 641 to receive the radio frequency input signal RFIN via the LC trap circuit 513 and an output capacitor 651 coupled respectively to the inductor devices 671, 681, the output capacitor 651 having a variable capacitance C.

Although the present invention has been described in terms of specific exemplary embodiments, it will be appreciated that various modifications and alterations might be made by those skilled in the art without departing from the spirit and scope of the invention.

What is claimed is:

1. A radio frequency filter circuit comprising:
    an input capacitor device to receive a radio frequency input signal;
    at least two inductor devices coupled in series, one end of a first inductor device of said at least two inductor devices being coupled to said input capacitor device, said at least two inductor devices being center tapped into a center capacitor device coupled to ground; and
    an output capacitor device coupled to said at least two inductor devices, said output capacitor device not coupled to ground, said at least two inductor devices and said output capacitor device to filter said radio frequency input signal and to generate a differential output filtered signal.

2. The radio frequency filter circuit according to claim 1, wherein said at least two inductor devices further comprise discrete chip coils, discrete air coils, or planar coils.

3. A radio frequency filter circuit comprising:
    a high band filter circuit and a low band filter circuit, each of said filter circuits to receive a radio frequency input signal and to filter said radio frequency input signal;
    each of said filter circuits further comprising:
        an input capacitor device to receive a radio frequency input signal;
        at least two inductor devices coupled in series, one end of a first inductor device of said at least two inductor devices being coupled to said input capacitor device, said at least two inductor devices being center tapped into a center capacitor device coupled to ground; and
        an output capacitor device coupled to said at least two inductor devices, said output capacitor device not coupled to ground, said at least two inductor devices and said output capacitor device to filter said radio frequency input signal and to generate a differential output filtered signal.

4. The radio frequency filter circuit according to claim 3, wherein said at least two inductor devices of said each filter circuit further comprise discrete chip coils, discrete air coils, or planar coils.

5. The radio frequency filter circuit according to claim 3, further comprising:
an inductive-capacitive trap circuit coupled to said low band filter circuit to reduce an amplitude of said radio frequency input signal.

6. A television tuner system comprising:
a television tuner coupled to a radio frequency filter circuit; and
said radio frequency filter circuit further comprising:
a high band filter circuit and a low band filter circuit, each of said filter circuits to receive a radio frequency input signal and to filter said radio frequency input signal;
each of said filter circuits further comprising:
an input capacitor device to receive a radio frequency input signal;
at least two inductor devices coupled in series, one end of a first inductor device of said at least two inductor devices being coupled to said input capacitor device, said at least two inductor devices being center tapped into a center capacitor device coupled to ground; and
an output capacitor device coupled to said at least two inductor devices, said output capacitor device not coupled to ground, said at least two inductor devices and said output capacitor device to filter said radio frequency input signal and to generate a differential output filtered signal to said television tuner.

7. The television tuner system according to claim 6, wherein said at least two inductor devices of said each filter circuit further comprise discrete chip coils, discrete air coils, or planar coils.

8. The television tuner system according to claim 6, wherein said radio frequency filter circuit further comprises:
an inductive-capacitive trap circuit coupled to said low band filter circuit to reduce an amplitude of said radio frequency input signal.

9. The radio frequency filter circuit according to claim 1, wherein:
said output capacitor device is coupled to a second inductor device of said at least two inductor devices; and
said output capacitor device is not directly coupled to said center capacitor device.

10. The radio frequency filter circuit according to claim 1, wherein:
said center capacitor device is coupled to a first end of a second inductor device of said at least two inductor devices;
said output capacitor device is coupled to a second end of said second inductor device; and
said center capacitor device is not coupled to said second end of said second inductor device.

11. The radio frequency filter circuit according to claim 1, wherein:
said at least two inductor devices are center tapped into said center capacitor device at a center node; and
said center capacitor device is directly coupled to said at least two inductor devices at said center node.

12. The radio frequency filter circuit according to claim 3, wherein for each of said filter circuits:
said output capacitor device is coupled to a second inductor device of said at least two inductor devices; and
said output capacitor device is not directly coupled to said center capacitor device.

13. The radio frequency filter circuit according to claim 3, wherein for each of said filter circuits
said center capacitor device is coupled to a first end of a second inductor device of said at least two inductor devices;
said output capacitor device is coupled to a second end of said second inductor device; and
said center capacitor device is not coupled to said second end of said second inductor device.

14. The radio frequency filter circuit according to claim 3, wherein for each of said filter circuits:
said at least two inductor devices are center tapped into said center capacitor device at a center node; and
said center capacitor device is directly coupled to said at least two inductor devices at said center node.

15. The radio frequency filter circuit according to claim 6, wherein for each of said filter circuits:
said output capacitor device is coupled to a second inductor device of said at least two inductor devices; and
said output capacitor device is not directly coupled to said center capacitor device.

16. The radio frequency filter circuit according to claim 6, wherein for each of said filter circuits
said center capacitor device is coupled to a first end of a second inductor device of said at least two inductor devices;
said output capacitor device is coupled to a second end of said second inductor device; and
said center capacitor device is not coupled to said second end of said second inductor device.

17. The radio frequency filter circuit according to claim 6, wherein for each of said filter circuits:
said at least two inductor devices are center tapped into said center capacitor device at a center node; and
said center capacitor device is directly coupled to said at least two inductor devices at said center node.

* * * * *